United States Patent
Kimura et al.

(10) Patent No.: US 12,470,195 B2
(45) Date of Patent: Nov. 11, 2025

(54) ACOUSTIC WAVE DEVICE

(71) Applicant: Murata Manufacturing Co., Ltd., Nagaokakyo (JP)

(72) Inventors: Tetsuya Kimura, Nagaokakyo (JP); Naohiro Nodake, Nagaokakyo (JP); Yuta Ishii, Nagaokakyo (JP); Kazunori Inoue, Nagaokakyo (JP); Minefumi Ouchi, Nagaokakyo (JP); Sho Nagatomo, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 416 days.

(21) Appl. No.: 18/073,802

(22) Filed: Dec. 2, 2022

(65) Prior Publication Data
US 2023/0107416 A1 Apr. 6, 2023

Related U.S. Application Data

(63) Continuation of application No. PCT/JP2021/021061, filed on Jun. 2, 2021.

(51) Int. Cl.
*H03H 9/02* (2006.01)
*H03H 9/13* (2006.01)

(52) U.S. Cl.
CPC .......... *H03H 9/02* (2013.01); *H03H 9/02007* (2013.01); *H03H 9/02228* (2013.01); *H03H 9/132* (2013.01)

(58) Field of Classification Search
CPC ...... H03H 9/02; H03H 9/02228; H03H 9/132; H03H 9/02007

(Continued)

(56) References Cited

U.S. PATENT DOCUMENTS 10,491,192 B1 11/2019 Plesski et al.
2006/0279382 A1* 12/2006 Ohara ............... H03H 3/02
333/191

(Continued)

FOREIGN PATENT DOCUMENTS

JP 2013214954 A 10/2013
WO 2014054580 A1 4/2014

(Continued)

OTHER PUBLICATIONS

International Search Report in PCT/JP2021/021061, mailed Jul. 27, 2021, 3 pages.

(Continued)

*Primary Examiner* — Andrea Lindgren Baltzell
*Assistant Examiner* — Victor Cole
(74) *Attorney, Agent, or Firm* — Keating & Bennett, LLP

(57) ABSTRACT

An acoustic wave device includes a piezoelectric film and an IDT electrode on the piezoelectric film. The IDT electrode includes first and second busbars, at least one first electrode finger, and at least one second electrode finger. When an overlap region is defined as a region in which the first and second electrode fingers overlap each other in an acoustic wave propagation direction, points A2, B2, C2, and D2, defined as follows, are all outside the cavity when, at the points A2, B2, C2, and D2, xa>about 25 μm, ya>about 25 μm, xb>about 25 μm, yb>about 25 μm, xc>about 25 μm, yc>about 25 μm, xd>about 25 μm, and yd>about 25 μm.

20 Claims, 11 Drawing Sheets

(58) Field of Classification Search
USPC .......................................................... 333/187
See application file for complete search history.

(56) References Cited

U.S. PATENT DOCUMENTS

| | | | |
|---|---|---|---|
| 2011/0062826 A1* | 3/2011 | Umeki | H03H 9/0595 |
| | | | 310/344 |
| 2013/0069481 A1* | 3/2013 | Kimura | H03H 9/14541 |
| | | | 310/313 R |
| 2013/0088121 A1* | 4/2013 | Yaoi | H03H 9/131 |
| | | | 310/313 A |
| 2013/0234805 A1 | 9/2013 | Takahashi | |
| 2017/0026026 A1 | 1/2017 | Toyota | |
| 2019/0386635 A1 | 12/2019 | Plesski et al. | |

FOREIGN PATENT DOCUMENTS

| | | | |
|---|---|---|---|
| WO | 2015170528 A1 | 11/2015 | |
| WO | 2017077892 A1 | 5/2017 | |

OTHER PUBLICATIONS

Written Opinion in PCT/JP2021/021061, mailed Jul. 27, 2021, 7 pages.

\* cited by examiner

ACOUSTIC WAVE DEVICE

CROSS REFERENCE TO RELATED APPLICATIONS

This application claims the benefit of priority to Provisional Patent Application No. 63/034,007 filed on Jun. 3, 2020, Provisional Patent Application No. 63/034,009 filed Jun. 3, 2020 and Provisional Patent Application No. 63/176,521 filed Apr. 19, 2021, and is a Continuation application of PCT Application No. PCT/JP2021/021061 filed on Jun. 2, 2021. The entire contents of each application are hereby incorporated herein by reference.

BACKGROUND OF THE INVENTION

1. Field of the Invention

The present invention relates to an acoustic wave device having a structure in which a piezoelectric film is located over a cavity.

2. Description of the Related Art

Hitherto, acoustic wave devices having a structure in which a piezoelectric film is located over a cavity are known. An example of such an acoustic wave device is described in U.S. Pat. No. 10,491,192.

In an acoustic wave device having a structure in which a piezoelectric film is located over a cavity, cracks may occur in the piezoelectric film located over the cavity during a manufacturing process or in use.

SUMMARY OF THE INVENTION

Preferred embodiments of the present invention provide acoustic wave devices in each of which cracks are less likely to occur in a piezoelectric film located over a cavity.

An acoustic wave device according to a preferred embodiment of the present invention includes a support substrate including a recess, a piezoelectric film covering the recess of the support substrate and defining a cavity together with the recess, and a functional electrode on the piezoelectric film. The functional electrode includes first and second busbars, at least one first electrode finger including one end connected to the first busbar, and at least one second electrode finger including one end connected to the second busbar. When an overlap region is defined as a region in which the first and second electrode fingers overlap each other in an acoustic wave propagation direction, points A2, B2, C2, and D2 are all outside the cavity when, at the points A2, B2, C2, and D2, xa>about 25 μm, ya>about 25 μm, xb>about 25 μm, yb>about 25 μm, xc>about 25 μm, yc>about 25 μm, xd>about 25 μm, and yd>about 25 μm. The points A2, B2, C2, and D2 are defined as follows: point A2: a point shifted from a point A1 as a starting point by xa in an x direction and by ya in a y direction toward the outside of the overlap region, point B2: a point shifted from a point B1 as a starting point by xb in the x direction and by yb in the y direction toward the outside of the overlap region, point C2: a point shifted from a point C1 as a starting point by xc in the x direction and by yc in the y direction toward the outside of the overlap region, point D2: a point shifted from a point D1 as a starting point by xd in the x direction and by yd in the y direction toward the outside of the overlap region. The points A1, B1, C1, and D1 are defined as follows: point A1: an intersection of an outer edge of an outermost electrode on one end side in the acoustic wave propagation direction and the first busbar, point B1: an intersection of an extension line of an outer edge of an outermost electrode on another end side in the acoustic wave propagation direction and the first busbar, point C1: an intersection of an extension line of the outer edge of the outermost electrode on the one end side in the acoustic wave propagation direction and the second busbar, point D1: an intersection of the outer edge of the outermost electrode on the other end side in the acoustic wave propagation direction and the second busbar.

An acoustic wave device according to a preferred embodiment of the present invention includes a support substrate including a recess, a piezoelectric film covering the recess of the support substrate and defining a cavity together with the recess, and a functional electrode on the piezoelectric film. The functional electrode includes first and second busbars, at least one first electrode finger including one end connected to the first busbar, and at least one second electrode finger including one end connected to the second busbar. When an overlap region is defined as a region in which the first and second electrode fingers overlap each other in an acoustic wave propagation direction, points A2, B2, C2, and D2 are all inside the cavity when, at the points A2, B2, C2, and D2, xa<about 2 μm, ya<about 2 μm, xb<about 2 μm, yb<about 2 μm, xc<about 2 μm, yc<about 2 μm, xd<about 2 μm, and yd<about 2 μm. The points A2, B2, C2, and D2 are defined as follows: point A2: a point shifted from a point A1 as a starting point by xa in an x direction and by ya in a y direction toward the outside of the overlap region, point B2: a point shifted from a point B1 as a starting point by xb in the x direction and by yb in the y direction toward the outside of the overlap region, point C2: a point shifted from a point C1 as a starting point by xc in the x direction and by yc in the y direction toward the outside of the overlap region, point D2: a point shifted from a point D1 as a starting point by xd in the x direction and by yd in the y direction toward the outside of the overlap region. The points A1, B1, C1, and D1 are defined as follows: point A1: an intersection of an outer edge of an outermost electrode on one end side in the acoustic wave propagation direction and the first busbar, point B1: an intersection of an extension line of an outer edge of an outermost electrode on another end side in the acoustic wave propagation direction and the first busbar, point C1: an intersection of an extension line of the outer edge of the outermost electrode on the one end side in the acoustic wave propagation direction and the second busbar, point D1: an intersection of the outer edge of the outermost electrode on the other end side in the acoustic wave propagation direction and the second busbar.

According to preferred embodiments of the present invention, it is possible to provide acoustic wave devices in each of which cracks are less likely to occur in a piezoelectric film located over a cavity.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Hereinafter, preferred embodiments of the present invention will be described with reference to the drawings to clarify the present invention.

The preferred embodiments described herein are merely examples, and partial replacement or combination of elements of different preferred embodiments is possible.

An acoustic wave device according to a preferred embodiment of the present invention includes a support substrate including a recess, a piezoelectric film covering the recess of the support substrate and defining a cavity together with the recess, and a functional electrode provided on the piezoelectric film. The functional electrode includes first and second busbars, at least one first electrode finger including one end connected to the first busbar, and at least one second electrode finger including one end connected to the second busbar.

Preferred embodiments of the present invention provide acoustic wave devices having a structure in which a piezoelectric film is located over a cavity and cracks are less likely to occur in the piezoelectric film located over the cavity.

First, first to third structural examples as basic structures of acoustic wave devices according to preferred embodiments of the present invention will be described with reference to FIGS. 1 to 8.

In the first structural example, a bulk wave in a thickness shear mode is used. In the second structural example, the first electrode finger and the second electrode finger are adjacent to each other, and when a thickness of the piezoelectric film is d and a distance between the centers of the first electrode finger and the second electrode finger is p, d/p is about 0.5 or less. With this configuration, in the first and second structural examples, a Q factor can be increased even when the size of the acoustic wave device is reduced.

In the third structural example, a Lamb wave is used as a plate wave. Thus, resonance characteristics due to the Lamb wave can be obtained.

Hereinafter, the first, second, and third specific structural examples will be described with reference to the drawings to clarify the present invention.

Figure 1A:
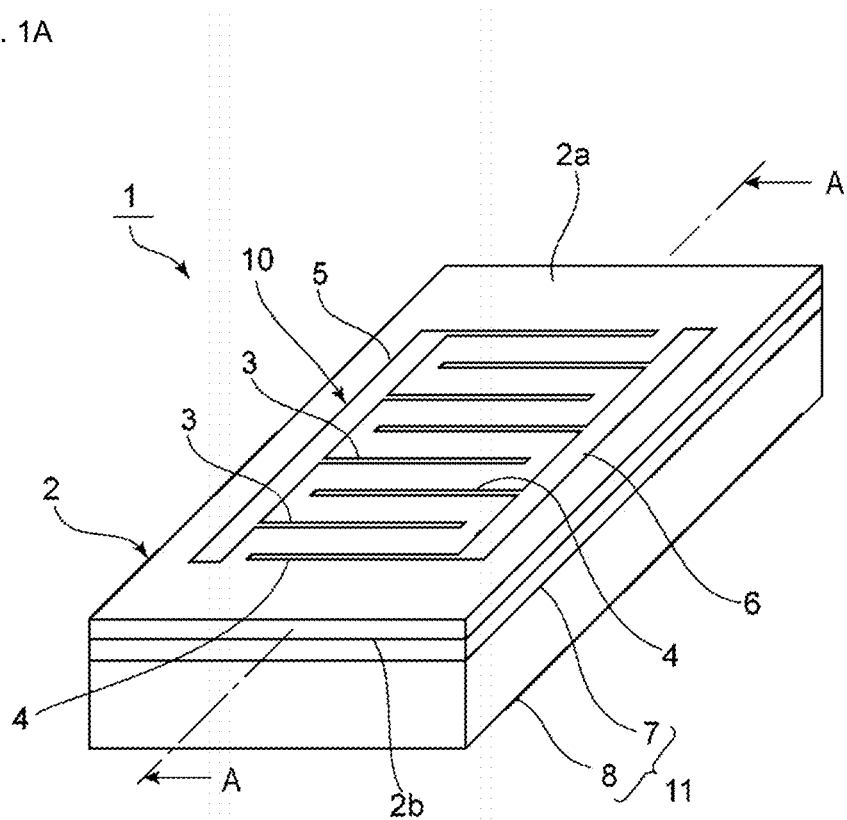
FIG. 1A is a schematic perspective view of an acoustic wave device according to a first preferred embodiment of the present invention.
Figure 1B:
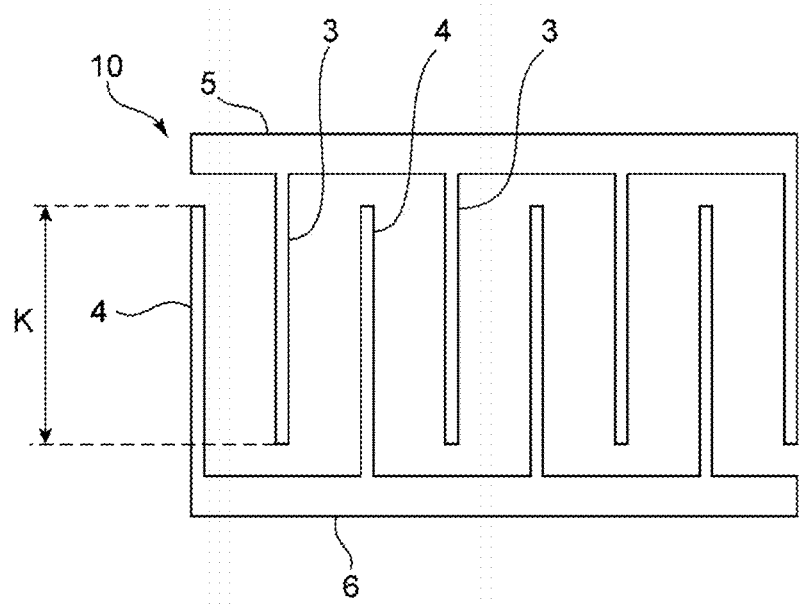
FIG. 1B is a plan view illustrating an electrode structure on a piezoelectric film acoustic wave device according to the first preferred embodiment of the present invention.
Figure 2:
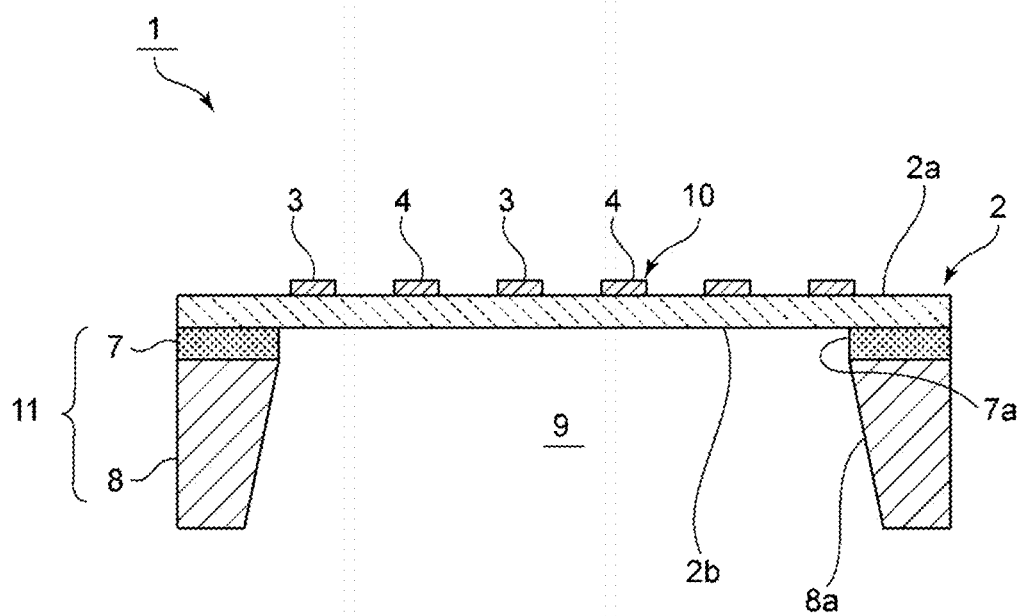
FIG. 2 is a cross-sectional view of a portion taken along line A-A in FIG. 1A.

FIG. 1A is a schematic perspective view of an acoustic wave device according to a first preferred embodiment of the present invention, FIG. 1B is a plan view illustrating an electrode structure on a piezoelectric film, and FIG. 2 is a cross-sectional view taken along line A-A in FIG. 1A. An acoustic wave device 1 illustrated in FIGS. 1A and 1B and FIG. 2 illustrates the first structural example to be described later, but the other structural examples have the same or substantially the same shape.

The acoustic wave device 1 includes a piezoelectric film 2 made of lithium niobate, for example. To be more specific, the piezoelectric film 2 is a $LiNbO_3$ layer, for example. However, the piezoelectric film 2 may be a lithium tantalate layer such as a $LiTaO_3$ layer, for example. The cut-angle of $LiNbO_3$ or $LiTaO_3$ is Z-cut in the present preferred embodiment, but may be rotated Y-cut or X-cut.

A thickness of the piezoelectric film 2 is not limited, but is preferably, for example, about 40 nm or more and about 1000 nm or less in order to effectively excite a thickness shear mode.

The piezoelectric film 2 includes first and second principal surfaces 2a and 2b facing each other. Electrode fingers 3 and 4 are provided on the first principal surface 2a. Here, the electrode fingers 3 are an example of "first electrode finger", and the electrode fingers 4 are an example of "second electrode finger". In FIGS. 1A and 1B, a plurality of electrode fingers 3 are connected to a first busbar 5. A plurality of electrode fingers 4 are connected to a second busbar 6. The plurality of electrode fingers 3 and the plurality of electrode fingers 4 are interdigitated with each other. The electrode fingers 3, the electrode fingers 4, the first busbar 5, and the second busbar 6 define a functional electrode. In the present preferred embodiment, the functional electrode is, for example, an interdigital transducer (IDT) electrode including the plurality of electrode fingers 3 and the plurality of electrode fingers 4. Although the plurality of electrode fingers 3 and the plurality of electrode fingers 4 are provided, it is sufficient that at least one electrode finger 3 and at least one electrode finger 4 are provided.

The electrode fingers 3 and the electrode fingers 4 have a rectangular or substantially rectangular shape and have a lengthwise direction. In a direction orthogonal to the lengthwise direction, the electrode fingers 3 and the adjacent electrode fingers 4 face each other. Both the lengthwise direction of the electrode fingers 3 and 4 and the direction orthogonal to the lengthwise direction of the electrode fingers 3 and 4 intersect a thickness-wise direction of the piezoelectric film 2. Therefore, it can also be said that the electrode fingers 3 and the adjacent electrode fingers 4 face each other in a direction intersecting the thickness-wise direction of the piezoelectric film 2.

Further, the lengthwise direction of the electrode fingers 3 and 4 may be interchanged with the direction orthogonal to the lengthwise direction of the electrode fingers 3 and 4 illustrated in FIGS. 1A and 1B. That is, in FIGS. 1A and 1B, the electrode fingers 3 and 4 may extend in the direction in which the first busbar 5 and the second busbar 6 extend. In this case, the first busbar 5 and the second busbar 6 extend in the direction in which the electrode fingers 3 and 4 extend in FIGS. 1A and 1B.

A plurality of pairs of an electrode finger 3 connected to one potential and an electrode finger 4 connected to another potential that are adjacent to each other are provided in the direction orthogonal to the lengthwise direction of the electrode fingers 3 and 4. Here, "an electrode finger 3 and an electrode finger 4 are adjacent to each other" does not mean that the electrode finger 3 and the electrode finger 4 are disposed so as to be in direct contact with each other, but means that the electrode finger 3 and the electrode finger 4 are disposed with a gap interposed therebetween. When an electrode finger 3 and an electrode finger 4 are adjacent to each other, there are no electrodes connected to a hot electrode or a ground electrode between the electrode finger 3 and the electrode finger 4, including the other electrode fingers 3 and 4. The number of pairs need not be an integer, but may be, for example, 1.5 pairs, 2.5 pairs, or the like.

A center-to-center distance between the electrode fingers 3 and 4, that is, a pitch, is preferably in a range of about 1 µm or more and about 10 µm or less, for example. The center-to-center distance between the electrode fingers 3 and 4 is a distance between the centers of width dimensions of the electrode fingers 3 in the direction orthogonal to the lengthwise direction of the electrode fingers 3 and the centers of width dimensions of the electrode fingers 4 in the direction orthogonal to the lengthwise direction of the electrode fingers 4. The widths of the electrode fingers 3 and 4, that is, the dimensions of the electrode fingers 3 and 4 in the direction in which the electrode fingers 3 and 4 face each other, are preferably in a range of about 50 nm or more and about 1000 nm or less, for example.

Further, in the present preferred embodiment, since the Z-cut piezoelectric film is used, the direction orthogonal to the lengthwise direction of the electrode fingers 3 and 4 is a direction orthogonal to a polarization direction of the piezoelectric film 2. This is not the case when a piezoelectric material having a different cut-angle is used as the piezoelectric film 2. Here, "orthogonal" is not limited to strictly orthogonal, but may also be substantially orthogonal (an angle between the direction orthogonal to the lengthwise direction of the electrode fingers 3 and 4 and the polarization direction is within a range of, for example, about 90°±10°).

A support member 11 is stacked on the second principal surface 2b side of the piezoelectric film 2. The support member 11 includes an insulating layer 7 and a support substrate 8 stacked on the insulating layer 7. The insulating layer 7 and the support substrate 8 are frame-shaped and include cavities 7a and 8a, as illustrated in FIG. 2. The cavities 7a and 8a are covered (blocked) by the piezoelectric film 2. Thus, a hollow portion 9 (cavity) is provided. The hollow portion 9 is provided so that the piezoelectric film 2 can vibrate in an excitation region. Therefore, the support substrate 8 is stacked on the second principal surface 2b with the insulating layer 7 interposed therebetween at a position not overlapping a portion where at least one pair of electrode fingers 3 and 4 are provided. The insulating layer 7 need not be provided. Thus, the support substrate 8 can be directly or indirectly stacked on the second principal surface 2b of the piezoelectric film 2.

The hollow portion 9 may be defined by a recess provided in the support substrate 8 instead of the cavity extending through the support substrate 8 as illustrated in FIG. 2. In other words, the hollow portion 9 may be surrounded by the recess of the support substrate 8, the cavity 7a of the insulating layer 7, and the piezoelectric film 2. The cavity 8a is not necessarily provided in the support substrate 8, and the cavity 7a may be provided only in the insulating layer 7. In addition, the insulating layer 7 may be provided with a recess instead of the cavity extending through the insulating layer 7 as illustrated in FIG. 2. Further, the cavity 7a is not necessarily provided in the insulating layer 7, and the cavity 8a may be provided only in the support substrate 8. That is, it is sufficient that the hollow portion 9 is provided in the support member 11 including the support substrate 8 (and the insulating layer 7 in some cases).

The hollow portion 9 is not necessarily provided in the support member 11, but may be provided in the piezoelectric film. For example, the hollow portion 9 may be configured to include a recess provided on the principal surface of the piezoelectric film on the support member 11 side.

The insulating layer 7 is made of silicon oxide, for example. However, instead of silicon oxide, a suitable insulating material such as, for example, silicon oxynitride or alumina may be used. The support substrate 8 is made of Si, for example. The plane orientation of a surface of Si on the piezoelectric film 2 side may be (100), (110), or (111). High-resistivity Si having a resistivity of about 4 kΩ or more is preferable, for example. However, the support substrate 8 can also be made of an appropriate insulating material or semiconductor material. For example, piezoelectric materials such as aluminum oxide, lithium tantalate, lithium niobate, and quartz; various ceramics such as alumina, sapphire, magnesia, silicon nitride, aluminum nitride, silicon carbide, zirconia, cordierite, mullite, steatite, and forsterite; dielectric materials such as diamond and glass; semiconductors such as gallium nitride; and resins can also be used.

The plurality of electrode fingers 3 and 4 and the first and second busbars 5 and 6 are made of a suitable metal or alloy such as, for example, Al or an Al—Cu alloy. In the present preferred embodiment, the electrode fingers 3 and 4 and the first and second busbars 5 and 6 include an Al film stacked on a Ti film defining and functioning as an adhesion layer. An adhesion layer other than the Ti film may be used.

For driving, an AC voltage is applied between the plurality of electrode fingers 3 and the plurality of electrode fingers 4. More specifically, an AC voltage is applied between the first busbar 5 and the second busbar 6. This makes it possible to obtain resonance characteristics using a bulk wave in a thickness shear mode such as a first-order thickness shear mode excited in the piezoelectric film 2. In the acoustic wave device 1, when the thickness of the piezoelectric film 2 is d and the center-to-center distance between any adjacent electrode fingers 3 and 4 among the plurality of pairs of electrode fingers 3 and 4 is p, d/p is about 0.5 or less, for example. That is, the acoustic wave device 1 also corresponds to the second structural example described above. Therefore, the bulk wave in the thickness shear mode is effectively excited, and good resonance characteristics can be obtained. More preferably, d/p is about 0.24 or less, for example, in which case better resonance characteristics can be obtained.

When there are a plurality of electrode fingers 3 or a plurality of electrode fingers 4, or both, as in the present preferred embodiment, that is, when there are 1.5 or more pairs of electrode fingers 3 and 4, with each pair of electrodes including one electrode finger 3 and one electrode finger 4, the center-to-center distance p between the adjacent electrode fingers 3 and 4 means the center-to-center distance between the electrode fingers 3 and 4 adjacent to each other.

Since the acoustic wave device 1 according to the present preferred embodiment has the above configuration, even when the number of pairs of electrode fingers 3 and 4 is reduced in order to reduce the size of the acoustic wave device 1, a Q factor is less likely to decrease. This is because the acoustic wave device 1 is a resonator that does not require a reflector on either side and has low propagation loss. In addition, reflectors as mentioned above are not necessarily required because the bulk wave in the thickness shear mode is used. A difference between a Lamb wave used in a conventional acoustic wave device and a bulk wave in the thickness shear mode will be described with reference to FIGS. 3A and 3B.

Figure 3A:
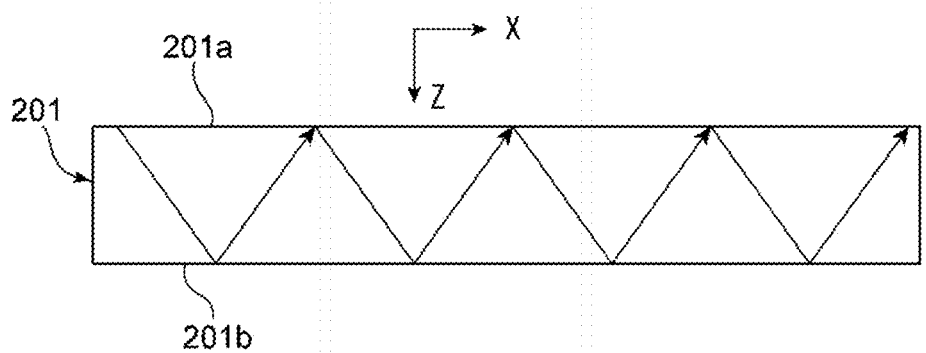
FIG. 3A is a schematic elevational cross-sectional view for explaining a Lamb wave propagating through a piezoelectric film of a conventional acoustic wave device.

FIG. 3A is a schematic elevational cross-sectional view illustrating a Lamb wave propagating through a piezoelectric film of an acoustic wave device as described in U.S. Pat. No. 10,491,192. Here, a wave propagates through a piezoelectric film 201 as indicated by arrows. Here, in the piezoelectric film 201, a first principal surface 201a and a second principal surface 201b face each other, and a thickness-wise direction connecting the first principal surface 201a and the second principal surface 201b is the Z direction. The X direction is a direction in which electrode fingers of an IDT electrode are arranged. As illustrated in FIG. 3A, the Lamb wave propagates in the X direction as illustrated. Although the piezoelectric film 201 vibrates as a whole, the wave is a plate wave and thus propagates in the X direction; therefore, reflectors are arranged on both sides to obtain resonance characteristics. This results in wave propagation loss, and when the size of the acoustic wave device is reduced, that is, when the number of pairs of electrode fingers is reduced, the Q factor decreases.

Figure 3B:
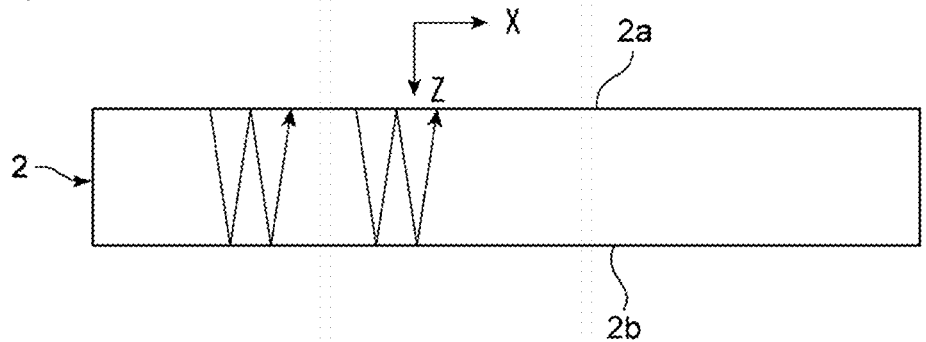
FIG. 3B is a schematic elevational cross-sectional view for explaining vibration in a thickness shear mode in the acoustic wave device according to the first preferred embodiment of the present invention.

On the other hand, as illustrated in FIG. 3B, in the acoustic wave device 1 of the present preferred embodiment, since the vibration displacement is in the thickness shear direction, the wave substantially propagates in the direction connecting the first principal surface 2a and the second principal surface 2b of the piezoelectric film 2, that is, in the Z direction, and resonates. That is, the X-direction component of the wave is significantly smaller than the Z-direction component of the wave. Since resonance characteristics are obtained by propagation of the wave in the Z direction, reflectors are not necessarily required. Therefore, there is no propagation loss that occurs when the wave propagates to the reflectors. Thus, even when the number of pairs of electrodes of the electrode fingers 3 and 4 is reduced in order to reduce the size of the acoustic wave device 1, the Q factor is less likely to decrease.

Figure 4:
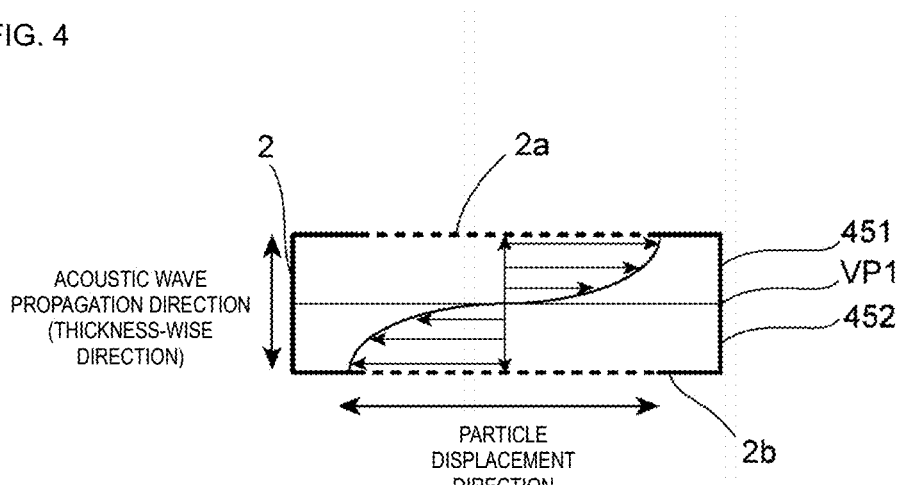
FIG. 4 is a diagram for explaining an amplitude direction of a bulk wave in a thickness shear mode in an acoustic wave device according to a preferred embodiment of the present invention.

As illustrated in FIG. 4, in the piezoelectric film 2, the amplitude direction of the bulk wave in the thickness shear mode is opposite between a first region 451 included in the excitation region and a second region 452 included in the excitation region. FIG. 4 schematically illustrates the bulk wave when a voltage is applied between the electrode fingers 3 and the electrode fingers 4 so that the electrode fingers 4 have a higher potential than the electrode fingers 3. The first region 451 is a region in the excitation region between a virtual plane VP1 that is orthogonal to the thickness-wise direction of the piezoelectric film 2 and divides the piezoelectric film 2 into two parts, and the first principal surface 2a. The second region 452 is a region in the excitation region between the virtual plane VP1 and the second principal surface 2b.

As described above, in the acoustic wave device 1, at least one pair of electrodes of the electrode fingers 3 and 4 are disposed. Since a wave does not propagate in the X direction, a plurality of pairs of electrodes composed of the electrode fingers 3 and 4 need not necessarily be provided. That is, it is sufficient that at least one pair of electrodes be provided.

For example, the electrode fingers 3 are electrodes connected to a hot potential, and the electrode fingers 4 are electrodes connected to a ground potential. However, the electrode fingers 3 may be connected to the ground potential and the electrode fingers 4 may be connected to the hot potential. In the present preferred embodiment, as described above, each of the at least one pair of electrodes is an electrode connected to the hot potential or an electrode connected to the ground potential, and no floating electrodes are provided.

Figure 5:
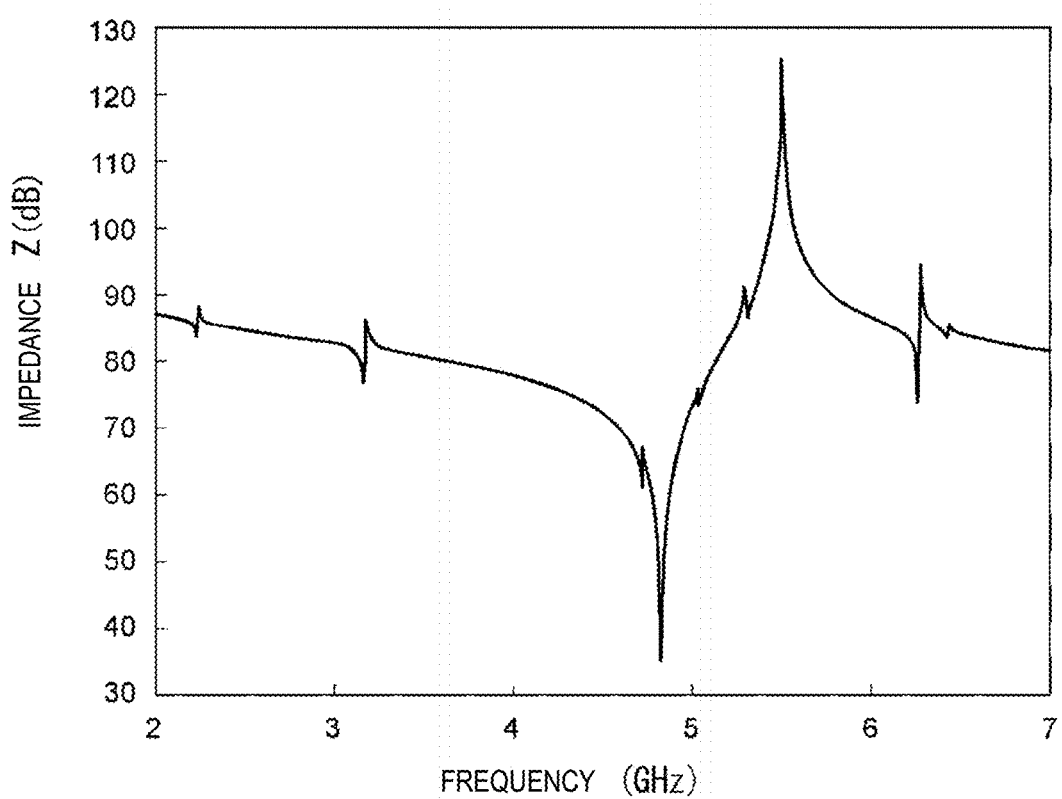
FIG. 5 is a diagram illustrating resonance characteristics of the acoustic wave device according to the first preferred embodiment of the present invention.

FIG. 5 is a diagram illustrating resonance characteristics of the acoustic wave device 1 according to the first preferred embodiment of the present invention. The design parameters of the acoustic wave device 1 having these resonance characteristics are as follows.

The piezoelectric film 2: made of $LiNbO_3$ with Euler angles (about 0°, about 0°, about 90°), and with a thickness of about 400 nm.

When viewed in a direction orthogonal to the lengthwise direction of the electrode fingers 3 and 4, the length of the region in which the electrode fingers 3 and 4 overlap each other, that is, the length of the excitation region C, is about 40 μm, the number of pairs of electrodes composed of the electrode fingers 3 and 4 is 21, the distance between the centers of the electrode fingers 3 and 4 is about 3 μm, the widths of the electrode fingers 3 and 4 are about 500 nm, and d/p is about 0.133.

The insulating layer 7: made of a silicon oxide film with a thickness of about 1 μm.

The support substrate 8: made of Si.

The length of the excitation region C is a dimension along the lengthwise direction of the electrode fingers 3 and 4 in the excitation region C.

In the present preferred embodiment, the distances between the electrode fingers of the plurality of pairs of electrodes of the electrode fingers 3 and 4 are all set to be equal or substantially equal. That is, the electrode fingers 3 and the electrode fingers 4 are arranged at equal or substantially equal pitches.

As is apparent from FIG. 5, good resonance characteristics with a fractional bandwidth of about 12.5% are obtained in spite of including no reflectors.

When the thickness of the piezoelectric film 2 is d and the distance between the centers of the electrode fingers 3 and 4 is p, d/p is preferably about 0.5 or less, more preferably about 0.24 or less, in the present preferred embodiment as described above. This will be described with reference to FIG. 6.

Figure 6:
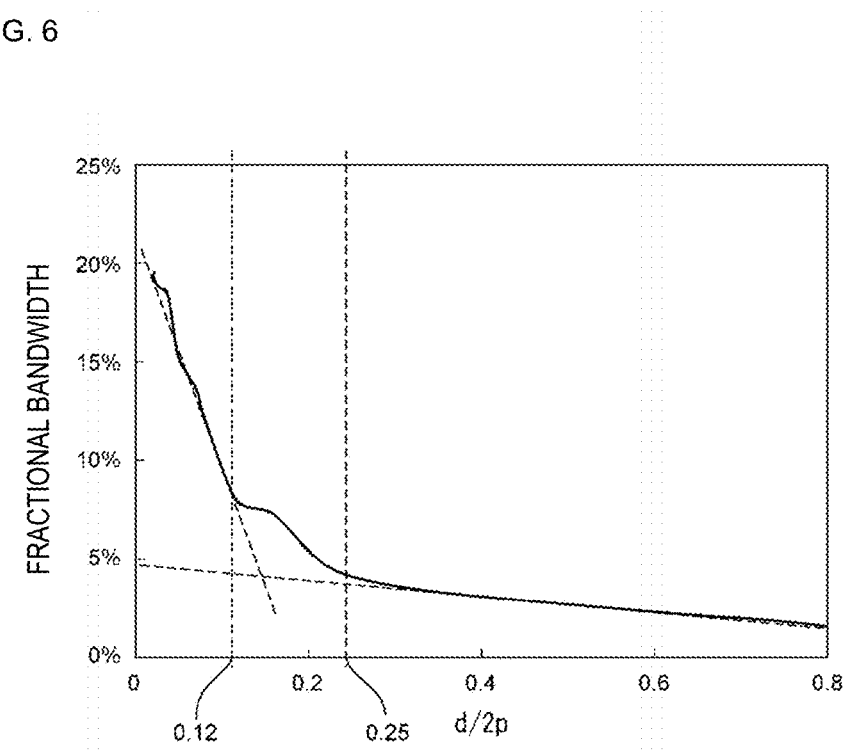
FIG. 6 is a diagram illustrating a relationship between d/2p in the acoustic wave device according to the first preferred embodiment of the present invention and a fractional bandwidth of the acoustic wave device as a resonator.

A plurality of acoustic wave devices were obtained in the same manner as the acoustic wave device having the resonance characteristics illustrated in FIG. 5 but with varying values of d/2p. FIG. 6 is a diagram illustrating a relationship between d/2p and the fractional bandwidth of the acoustic wave device as a resonator.

As is apparent from FIG. 6, when d/2p exceeds about 0.25, that is, when d/p>about 0.5, the fractional bandwidth is less than about 5% even when d/p is adjusted. On the other hand, when d/2p≤about 0.25, that is, d/p≤about 0.5, the fractional bandwidth can be increased to about 5% or more by changing d/p within this range; that is, a resonator having a high coupling coefficient can be obtained. When d/2p is about 0.12 or less, that is, when d/p is about 0.24 or less, the fractional bandwidth can be increased to about 7% or more. In addition, when d/p is adjusted within this range, a resonator having a wider fractional bandwidth can be obtained, and a resonator having a higher coupling coefficient can be achieved. Therefore, it can be seen that by setting d/p to about 0.5 or less as in the second structural example of the present application, a resonator having a high coupling coefficient using the bulk wave in the thickness shear mode can be generated.

As described above, the at least one pair of electrodes may be one pair, and in the case of one pair of electrodes, p is the center-to-center distance between the adjacent electrode fingers 3 and 4.

When the piezoelectric film 2 has thickness variations, its average thickness may be used as the thickness d of the piezoelectric film.

Figure 7:
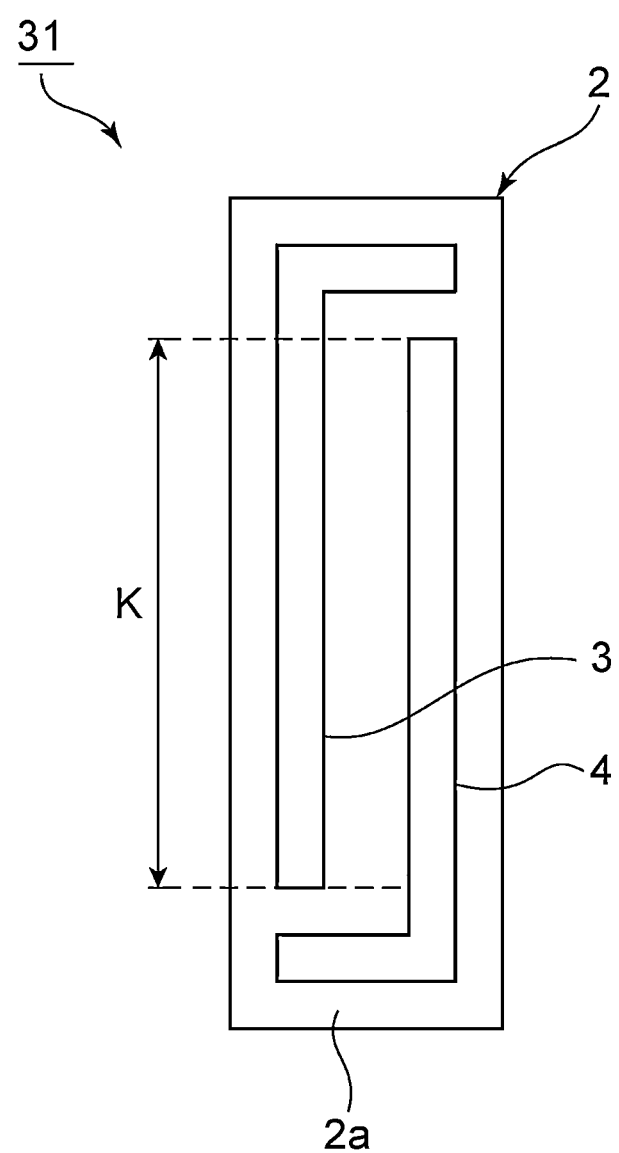
FIG. 7 is a plan view illustrating a first modification of the acoustic wave device according to the first preferred embodiment of the present invention.

FIG. 7 is a plan view illustrating a first modification of the acoustic wave device according to the first preferred embodiment of the present invention. In an acoustic wave device 31, a pair of electrodes including the electrode fingers 3 and 4 are provided on the first principal surface 2a of the piezoelectric film 2. K in FIG. 7 is an overlap region. The dimension in the direction in which the electrode fingers 3 and 4 extend in the overlap region is the overlap width. As described above, in the acoustic wave device of the present invention, the number of pairs of electrodes may be one. Also in this case, when d/p is about 0.5 or less, the bulk wave in the thickness shear mode can be effectively excited.

Figure 8:
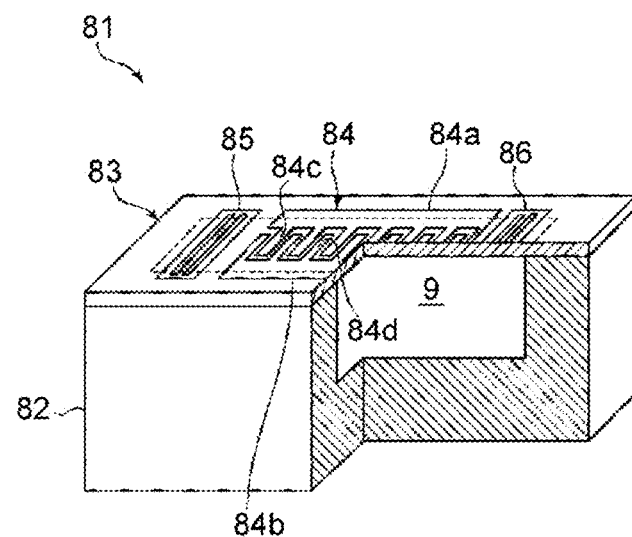
FIG. 8 is a partially cutaway perspective view for explaining a third structural example of an acoustic wave device according to a preferred embodiment of the present invention.

FIG. 8 is a partially cutaway perspective view for explaining the third structural example of the acoustic wave device according to the present invention.

An acoustic wave device 81 includes a support substrate 82. The support substrate 82 includes a recess that is open on the upper surface. A piezoelectric film 83 is stacked on the support substrate 82. Thus, the hollow portion 9 is provided. An IDT electrode 84 is provided on the piezoelectric film 83 over the hollow portion 9. Reflectors 85 and 86 are provided on both sides of the IDT electrode 84 in the acoustic wave propagation direction. In FIG. 8, a perimeter of the hollow portion 9 is indicated by a broken line. Here, the IDT electrode 84 includes first and second busbars 84a and 84b, a plurality of first electrode fingers 84c, and a plurality of second electrode fingers 84d. The plurality of first electrode fingers 84c are connected to the first busbar 84a. The plurality of second electrode fingers 84d are connected to the second busbar 84b. The plurality of first electrode fingers 84c and the plurality of second electrode fingers 84d are interdigitated with each other.

In the acoustic wave device 81, a Lamb wave as a plate wave is excited by applying an AC electric field to the IDT electrode 84 over the hollow portion 9. Since the reflectors 85 and 86 are provided on both sides, resonance characteristics due to the Lamb wave can be obtained. Thus, the acoustic wave device according to a preferred embodiment of the present invention may use plate waves.

Figure 9:
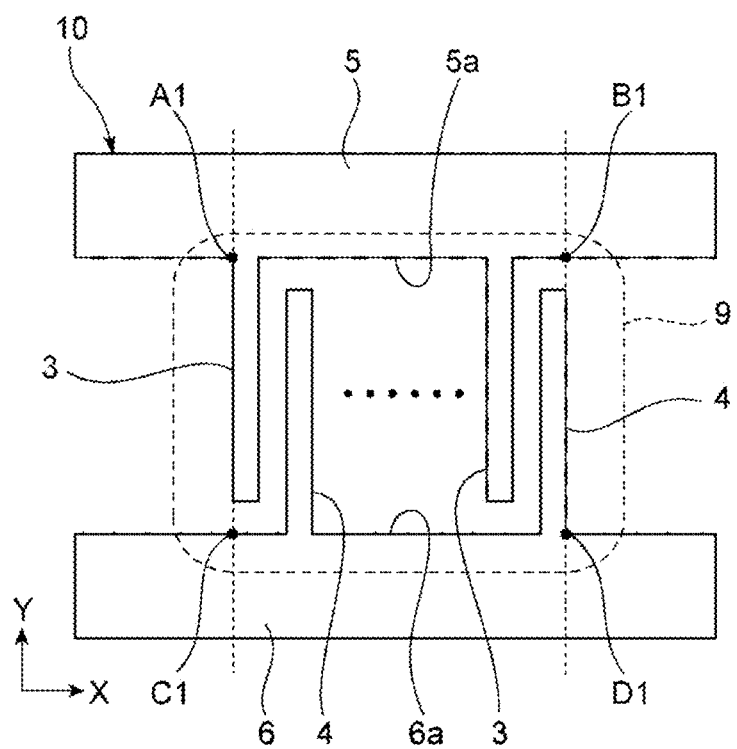
FIG. 9 is a schematic plan view illustrating a relationship between an electrode and a cavity located below the electrode in the acoustic wave device according to the first preferred embodiment of the present invention.

FIG. 9 is a schematic plan view for explaining a relationship between a position of the cavity and an electrode structure in the acoustic wave device according to the first preferred embodiment of the present invention illustrated in FIGS. 1A, 1B, and 2.

As illustrated in FIG. 9, an IDT electrode 10 is located over the hollow portion 9 located on the lower side. The IDT electrode 10 includes the first busbar 5 and the second busbar 6 described above. One end of each of the plurality of first electrode fingers 3 is connected to the first busbar 5. One end of each of the plurality of second electrode fingers 4 is connected to the second busbar 6. The plurality of first electrode fingers 3 and the plurality of second electrode fingers 4 are interdigitated with each other. Since the hollow portion 9 is located on the lower side, vibration is less likely to be disturbed when a voltage is applied between the electrode fingers 3 and the electrode fingers 4. In addition, as described above, in the acoustic wave device 1 of the first preferred embodiment, good resonance characteristics using the thickness shear mode are obtained, and the Q factor can be increased because d/p is about 0.5 or less.

The inventors of preferred embodiments of the present application have discovered that in a structure in which the piezoelectric film 2 is located over the hollow portion 9, cracks may occur in the piezoelectric film 2 located over the hollow portion 9.

In the acoustic wave device 1 according to the first preferred embodiment, an overlap region is defined as a region in which the first and second electrode fingers 3 and 4 overlap each other in the acoustic wave propagation direction. In this case, at points A2, B2, C2, and D2, xa>about 25 μm, ya>about 25 μm,
xb>about 25 μm, yb>about 25 μm,
xc>about 25 μm, yc>about 25 μm,
xd>about 25 μm, and yd>about 25 μm.

The points A2, B2, C2, and D2 are defined as follows:

point A2: a point shifted from a point A1 as a starting point by xa in an x direction and by ya in a y direction toward the outside of the overlap region, point B2: a point shifted from a point B1 as a starting point by xb in the x direction and by yb in the y direction toward the outside of the overlap region, point C2: a point shifted from a point C1 as a starting point by xc in the x direction and by yc in the y direction toward the outside of the overlap region, and point D2: a point shifted from a point D1 as a starting point by xd in the x direction and by yd in the y direction toward the outside of the overlap region.

The points A1, B1, C1, and D1 are defined as follows:

point A1: an intersection of an outer edge of an outermost electrode on one end side in the acoustic wave propagation direction and the first busbar, point B1: an intersection of an extension line of an outer edge of an outermost electrode on another end side in the acoustic wave propagation direction and the first busbar, point C1: an intersection of an extension line of the outer edge of the outermost electrode on the one end side in the acoustic wave propagation direction and the second busbar, and point D1: an intersection of the outer edge of the outermost electrode on the other end side in the acoustic wave propagation direction and the second busbar.

Therefore, the acoustic wave device 1 in which cracks are less likely to occur in the piezoelectric film can be provided. The points A1, B1, C1, and D1 and the distances xa to xd and ya to yd will be described with reference to FIGS. 9 and 10.

First, as illustrated in FIG. 9, each of the points A1, B1, C1, and D1 is an intersection of a straight line passing through an outer edge of an outermost electrode finger in the acoustic wave propagation direction and the first busbar 5 or the second busbar 6. For example, the point A1 is an intersection of an outer edge of the outermost first electrode finger 3 and an inner edge 5a of the first busbar 5. The point C1 is an intersection of a straight line passing through the outer edge of the first electrode finger 3 and an inner edge 6a of the second busbar 6.

The point B1 is an intersection of a straight line passing through an outer edge of the outermost second electrode finger 4 and the inner edge 5a of the first busbar 5. The point D1 is an intersection of the outer edge of the second electrode finger 4 and the inner edge 6a of the second busbar 6.

Figure 10:
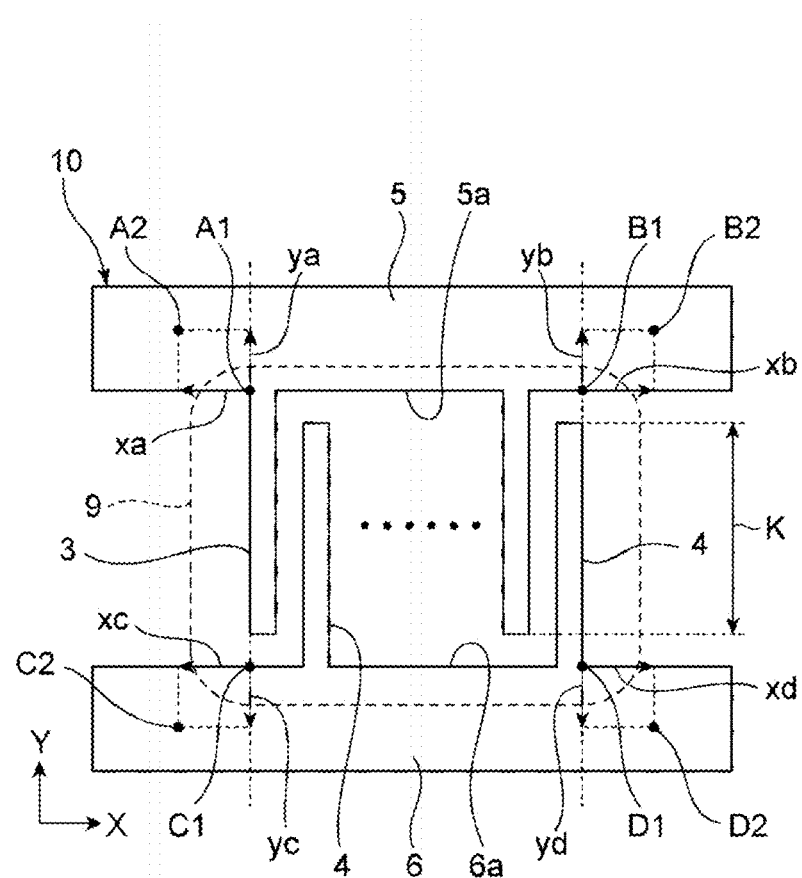
FIG. 10 is a plan view for explaining definitions of points A2, B2, C2, and D2 in the acoustic wave device according to the first preferred embodiment of the present invention.

The points A2, B2, C2, and D2 illustrated in FIG. 10 are defined based on the points A1 to D1, respectively, defined in this way.

That is, when the acoustic wave propagation direction is X and a widthwise direction orthogonal or substantially orthogonal to the acoustic wave propagation direction X is Y, as described above, the point A2 is a point shifted from the point A1 by xa in the X direction and by ya in the Y direction. Similarly, the point B2 is a point shifted from the point B1 by xb in the X direction and by yb in the Y direction toward the outside of the overlap region K. The point C2 is a point shifted from the point C1 as a starting point by xc in the X direction and yc in the Y direction toward the outside of the overlap region K. The point D2 is a point shifted from the point D1 as a starting point by xd in the X direction and yd in the Y direction toward the outside of the overlap region K.

A large number of acoustic wave devices having a piezoelectric film with a thickness of about 500 nm were prepared with varying values of the parameters xa to xd and ya to yd and were inspected for the presence or absence of cracks in the piezoelectric film. The results are shown in Table 1 below. The unit of the parameters xa to xd and ya to yd is nm.

TABLE 1

| xa | xb | xc | xd | ya | yb | yc | yd | Qmax | Crack |
|---|---|---|---|---|---|---|---|---|---|
| 0 | 0 | 0 | 0 | 0 | 0 | 0 | 0 | 450 | Absent |
| 1 | 1 | 1 | 1 | 1 | 1 | 1 | 1 | 462 | Absent |
| 2 | 2 | 2 | 2 | 2 | 2 | 2 | 2 | 495 | Absent |
| 3 | 3 | 3 | 3 | 3 | 3 | 3 | 3 | 498 | Absent |
| 4 | 4 | 4 | 4 | 4 | 4 | 4 | 4 | 495 | Absent |
| 5 | 5 | 5 | 5 | 5 | 5 | 5 | 5 | 497 | Absent |
| 6 | 6 | 6 | 6 | 6 | 6 | 6 | 6 | 505 | Absent |
| 7 | 7 | 7 | 7 | 7 | 7 | 7 | 7 | 501 | Absent |
| 8 | 8 | 8 | 8 | 8 | 8 | 8 | 8 | 498 | Absent |
| 9 | 9 | 9 | 9 | 9 | 9 | 9 | 9 | 496 | Absent |
| 10 | 10 | 10 | 10 | 10 | 10 | 10 | 10 | 512 | Absent |
| 11 | 11 | 11 | 11 | 11 | 11 | 11 | 11 | 506 | Absent |

TABLE 1-continued

| xa | xb | xc | xd | ya | yb | yc | yd | Qmax | Crack |
|---|---|---|---|---|---|---|---|---|---|
| 12 | 12 | 12 | 12 | 12 | 12 | 12 | 12 | 489 | Absent |
| 13 | 13 | 13 | 13 | 13 | 13 | 13 | 13 | 496 | Absent |
| 14 | 14 | 14 | 14 | 14 | 14 | 14 | 14 | 488 | Absent |
| 15 | 15 | 15 | 15 | 15 | 15 | 15 | 15 | 501 | Absent |
| 16 | 16 | 16 | 16 | 16 | 16 | 16 | 16 | 511 | Absent |
| 17 | 17 | 17 | 17 | 17 | 17 | 17 | 17 | 493 | Absent |
| 18 | 18 | 18 | 18 | 18 | 18 | 18 | 18 | 503 | Absent |
| 19 | 19 | 19 | 19 | 19 | 19 | 19 | 19 | 510 | Absent |
| 20 | 20 | 20 | 20 | 20 | 20 | 20 | 20 | 499 | Absent |
| 21 | 21 | 21 | 21 | 21 | 21 | 21 | 21 | 487 | Absent |
| 22 | 22 | 22 | 22 | 22 | 22 | 22 | 22 | 498 | Absent |
| 23 | 23 | 23 | 23 | 23 | 23 | 23 | 23 | 481 | Absent |
| 24 | 24 | 24 | 24 | 24 | 24 | 24 | 24 | 477 | Absent |
| 25 | 25 | 25 | 25 | 25 | 25 | 25 | 25 | 481 | Absent |
| 26 | 26 | 26 | 26 | 26 | 26 | 26 | 26 | | Present |
| 27 | 27 | 27 | 27 | 27 | 27 | 27 | 27 | | Present |
| 28 | 28 | 28 | 28 | 28 | 28 | 28 | 28 | | Present |
| 29 | 29 | 29 | 29 | 29 | 29 | 29 | 29 | | Present |
| 30 | 30 | 30 | 30 | 30 | 30 | 30 | 30 | | Present |

Hereinafter, the parameters xa to xd are collectively referred to as "parameter x", and the parameters ya to yd are collectively referred to as "parameter y".

Figure 11:
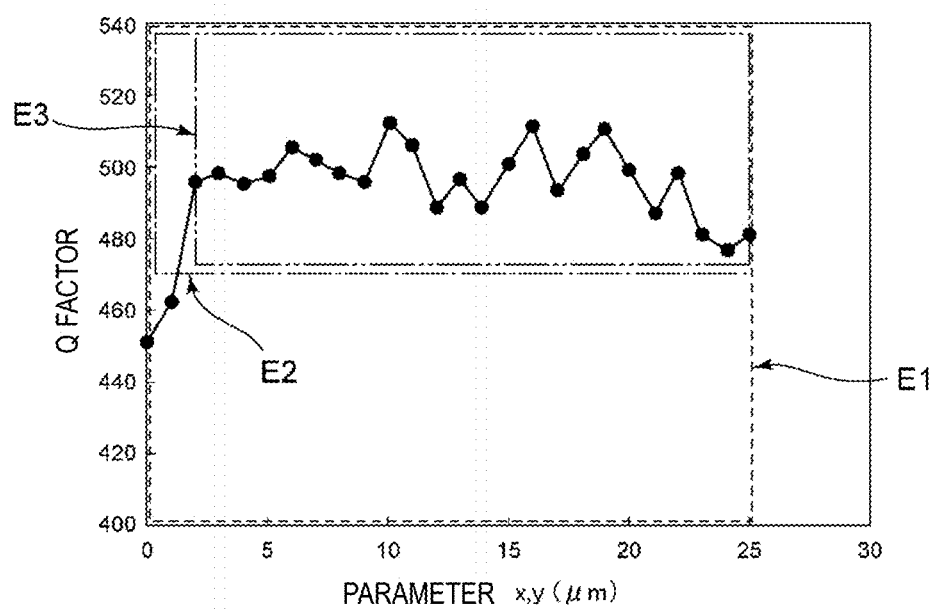
FIG. 11 is a diagram illustrating a relationship between a parameter x or y illustrated in FIG. 10 and a Q factor.

The results of the experiment are illustrated in a graph in FIG. 11. FIG. 11 is a diagram illustrating a relationship between the parameter x or y and the Q factor. A region E1 surrounded by a broken line in FIG. 11 indicates a region in which no cracks occurred in Table 1. A region E2 surrounded by a one-dot chain line indicates a region in which the Q factor, that is, the maximum value of Q, is about 470 or more, which is good. A region E3 surrounded by a two-dot chain line indicates a region where no cracks occurred and the Q factor is good.

From the results shown in Table 1 and FIG. 11 above, when condition [1] shown in Table 2 below is satisfied, an acoustic wave device in which cracks are less likely to occur in a piezoelectric film can be provided, and the yield can be increased.

More preferably, when the following condition [2] is satisfied, an acoustic wave device having a higher Q factor and capable of effectively using acoustic wave energy can be provided.

TABLE 2

| Conditions |
|---|
| [1] |
| The points A2, B2, C2, and D2 are all outside the cavity when |
| xa > 25 μm, ya > 25 μm, |
| xb > 25 μm, yb > 25 μm, |
| xc > 25 μm, yc > 25 μm, |
| xd > 25 μm, and yd > 25 μm. |
| [2] |
| The points A2, B2, C2, and D2 are all inside the cavity when |
| xa < 2 μm, ya < 2 μm, |
| xb < 2 μm, yb < 2 μm, |
| xc < 2 μm, yc < 2 μm, |
| xd < 2 μm, and yd < 2 μm. |

The inventors of preferred embodiments of the present application have confirmed that, when the thickness of the piezoelectric film is within a range of about 500 nm±300 nm, cracks are less likely to occur when the above condition [1] is satisfied. That is, the inventors of preferred embodiments of the present application have confirmed that the above advantageous effect can be obtained when the piezoelectric film is made of one of lithium niobate and lithium tantalate.

Figure 12:
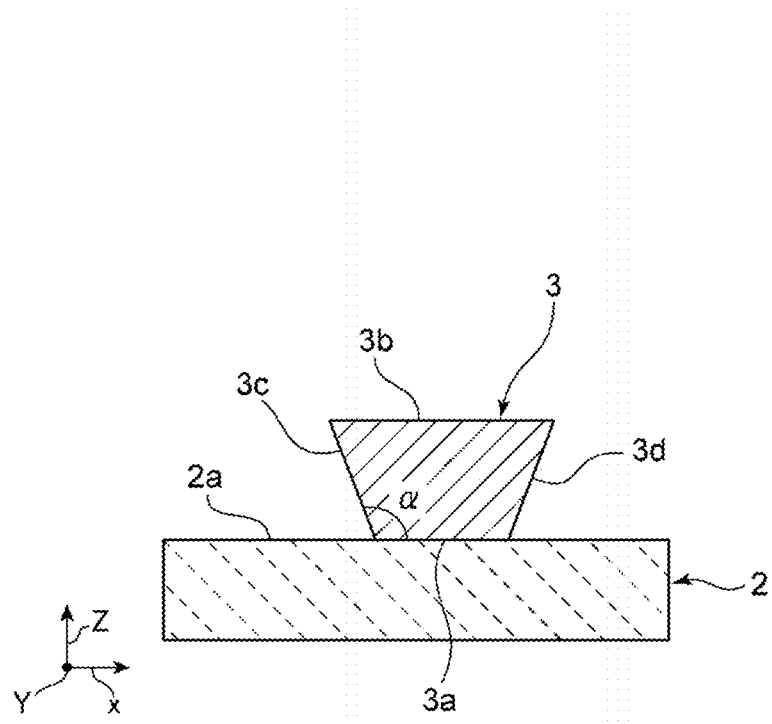
FIG. 12 is a partially cutaway cross-sectional view for explaining an angle between an inclined side surface of an electrode finger and a principal surface of a piezoelectric film in an acoustic wave device according to a second preferred embodiment of the present invention.

FIG. 12 is a partially cutaway cross-sectional view for explaining an angle α between an inclined side surface of an electrode finger and a piezoelectric film in an acoustic wave device according to a second preferred embodiment of the present invention. The acoustic wave device according to the second preferred embodiment is the same or substantially the same as the acoustic wave device 1 according to the first preferred embodiment except that inclined side surfaces described below are provided. Therefore, the descriptions provided for the first preferred embodiment will be quoted for the portions other than the inclined side surfaces.

The cross section illustrated in FIG. 12 illustrates a portion obtained by cutting a first electrode finger 3 in a direction orthogonal to a direction in which the electrode finger extends, that is, in the Y direction. Preferably, the angle α between the first and second electrode fingers 3 and 4 and a principal surface of the piezoelectric film 2 is set to α>about 90°. More specifically, the first electrode finger 3 includes a first surface 3a located on the piezoelectric film 2 side, a second surface 3b facing the first surface 3a, and side surfaces 3c and 3d connected to the first surface 3a and the second surface 3b. The side surfaces 3c and 3d are inclined as illustrated in FIG. 12. Therefore, the first electrode finger 3 is a side-surface-inclined electrode finger. The angle between the side surfaces 3c and 3d and the principal surface 2a of the piezoelectric film 2 is α. In the first electrode finger 3, α>about 90° in a portion where the side surface 3c is connected to the first surface 3a. Here, the angle α is an angle between the principal surface 2a of the piezoelectric film 2 and the side surface 3c or the side surface 3d of the first electrode finger 3, as illustrated in FIG. 12. The first electrode finger 3 is preferably a side-surface-inclined electrode finger as illustrated in FIG. 12, and has a reverse-tapered cross section.

In the present preferred embodiment, the angle α between the side surfaces 3c and 3d of the first electrode finger 3, as well as a pair of side surfaces of the second electrode finger, and the principal surface 2a of the piezoelectric film 2 is set to α>about 90°.

Thus, since the angle α is greater than about 90° and the first electrode finger 3 has a reverse-tapered shape, unnecessary modes can be effectively reduced in the acoustic wave device 1. When the first electrode finger 3 has a forward-tapered cross section, unnecessary modes are likely to occur.

Figure 13A:
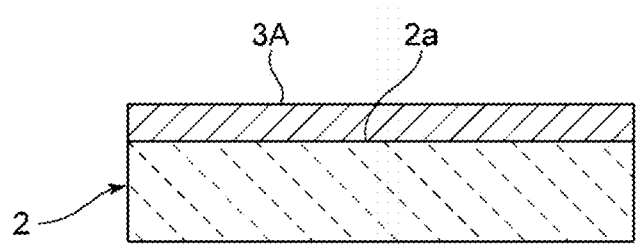
FIGS. 13A to 13C are partially cutaway elevational cross-sectional views for explaining a process of manufacturing the acoustic wave device of the second preferred embodiment.
Figure 13B:
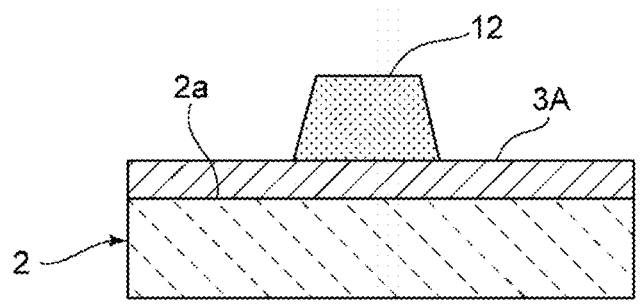
Figure 13C:
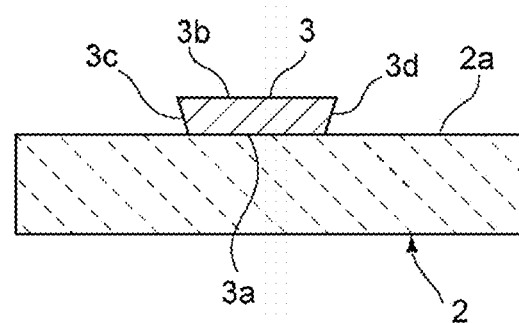

FIGS. 13A to 13C are partially cutaway elevational cross-sectional views, illustrating a non-limiting example of a process of manufacturing the acoustic wave device, for explaining a process of forming the first electrode finger 3 having the angle α. First, a layer of an electrode material 3A is deposited on the principal surface 2a of the piezoelectric film 2. Subsequently, a resist layer is formed on the electrode material 3A. Subsequently, the resist layer is patterned to form a resist pattern 12 illustrated in FIG. 13B. This protects a portion where the electrode finger is to be formed. Thereafter, the electrode material 3A outside the region where the electrode finger is to be formed is removed by dry etching. In addition, the resist pattern 12 is removed. In this way, as illustrated in FIG. 13C, the reverse-tapered first electrode finger 3 can be formed. In this case, the angle α can be controlled by controlling the dry etching conditions.

As illustrated in FIG. 12, the side-surface-inclined electrode finger may be formed such that the entire surfaces 3c and 3d form inclined surfaces, but the side-surface-inclined electrode finger is not limited to any particular structure as long as the side surfaces include inclined surface portions. Such modifications will be described below.

Figure 14:
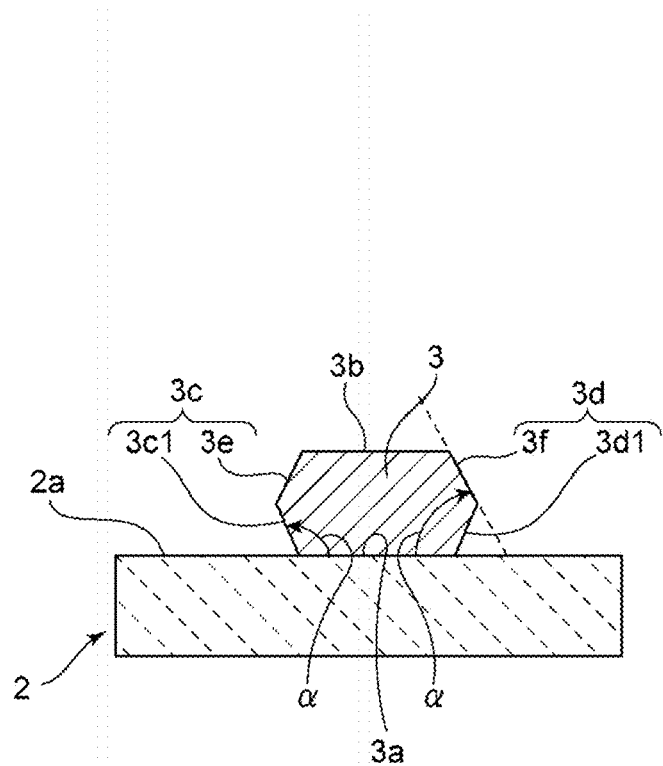
FIG. 14 is a partially cutaway elevational cross-sectional view for explaining a first modification of the acoustic wave device according to the second preferred embodiment of the present invention.

FIG. 14 is a partially cutaway elevational cross-sectional view for explaining a first modification of the acoustic wave device according to the second preferred embodiment.

The first electrode finger 3 illustrated in FIG. 14 is a side-surface-inclined electrode finger and includes the side surface 3c and the side surface 3d. However, the side surface 3c includes a first portion 3c and a second portion 3e. Similarly, the side surface 3d includes a first portion 3d1 and a second portion 3f. The first portion 3c is connected to the first surface 3a and is located closer to the first surface 3a side than is the second portion 3e. The second portion 3e is connected to the second surface 3b and is located closer to the second surface 3b side than is the first portion 3c1. There is also the same or similar relationship between the first portion 3d1 and the second portion 3f.

The portions extending from the first surface 3a to an intermediate height position form the first portions 3c and 3d1, which are reverse-tapered. The second portions 3e and 3f are forward-tapered. On the other hand, in the first portions 3c and 3d1, angle α>about 90°. Thus, also in this case, unnecessary modes can be effectively reduced. In this way, the side surfaces 3c and 3d do not need to satisfy α>about 90° in their entirety. When the side surfaces of each electrode finger 3 are inclined side surfaces, the upper portions of the inclined side surfaces may be side surfaces forming forward tapers, that is, portions with α<about 90°.

Figure 15:
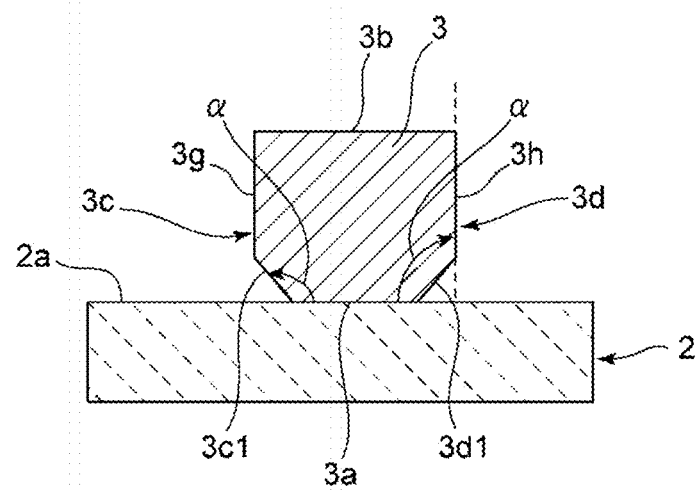
FIG. 15 is a partially cutaway elevational cross-sectional view for explaining a second modification of the acoustic wave device according to the second preferred embodiment of the present invention.

FIG. 15 is a partially cutaway elevational cross-sectional view for explaining a second modification of the acoustic wave device according to the second preferred embodiment. As illustrated in FIG. 15, in the first portions 3c and 3d1 connected to the first surface 3a, angle α>about 90°. In third portions 3g and 3h of the side surfaces 3c and 3d, angle α=about 90°. That is, the third portions 3g and 3h extend in a direction connecting the first surface 3a and the second surface 3b. Also in this case, since α>about 90° in the first portions 3c and 3d1, unnecessary modes can be suppressed. Furthermore, since α=about 90° in the third portions 3g and 3h, unnecessary modes can be reduced or prevented more effectively than in the first modification illustrated in FIG. 14.

Figure 16A:
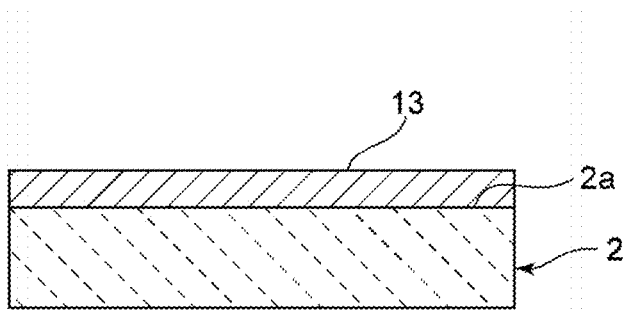
FIGS. 16A to 16C are partially cutaway elevational cross-sectional views for explaining a process of forming a first electrode finger illustrated in FIG. 14.
Figure 16B:
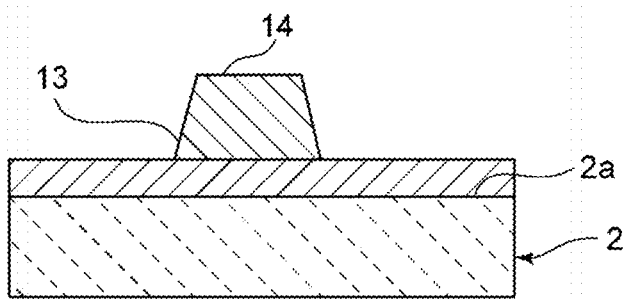
Figure 16C:
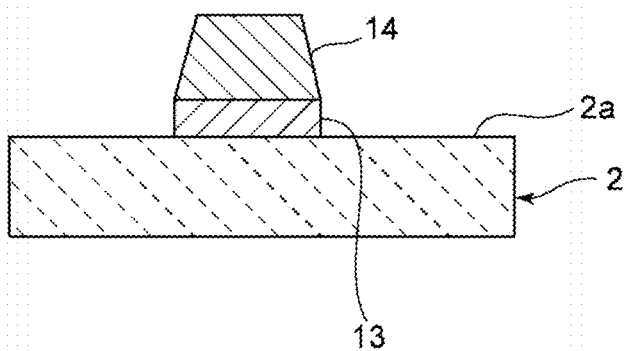

FIGS. 16A to 16C include illustrations for explaining a non-limiting example of a process of forming the first electrode finger illustrated in FIG. 14. FIGS. 16A to 16C are partially cutaway elevational cross-sectional views for explaining the process of forming the first electrode finger 3 illustrated in FIG. 14.

First, as illustrated in FIG. 16A, a lower electrode 13 is formed on the principal surface 2a of the piezoelectric film 2. Here, a material of the lower electrode 13 is Ti, for example. The material of the lower electrode may be, for example, Al, Mo, a composite material of, for example, another metal and carbon, or the like instead of Ti.

Subsequently, an upper electrode 14 illustrated in FIG. 16B is formed by, for example, vapor deposition and lift-off. The material of the upper electrode 14 may be, for example, Al, Cu, Pt, or an alloy including any of these elements. A material including Al or Cu, for example, is preferable. Thus, the electrical resistance can be lowered. In the present preferred embodiment, the upper electrode 14 is made of an Al—Cu alloy, for example.

Subsequently, the lower electrode 13 is removed except for a portion located below the upper electrode 14 by dry etching using, for example, $CF_4$ gas. In this case, the angle α of the side surfaces 3c and 3d of the lower electrode 13 can be controlled by controlling the dry etching conditions.

While preferred embodiments of the present invention have been described above, it is to be understood that

What is claimed is:

1. An acoustic wave device comprising:
a support substrate including a recess;
a piezoelectric film covering the recess of the support substrate and defining a cavity together with the recess; and
a functional electrode on the piezoelectric film; wherein
the functional electrode includes:
 first and second busbars;
 at least one first electrode finger including one end connected to the first busbar; and
 at least one second electrode finger including one end connected to the second busbar; and
when an overlap region is defined as a region in which the first and second electrode fingers overlap each other in an acoustic wave propagation direction, points A2, B2, C2, and D2 are all outside the cavity when, at the points A2, B2, C2, and D2,
xa>about 25 μm, ya>about 25 μm;
xb>about 25 μm, yb>about 25 μm;
xc>about 25 μm, yc>about 25 μm;
xd>about 25 μm, and yd>about 25 μm;
the points A2, B2, C2, and D2 being defined as follows:
point A2: a point shifted from a point A1 as a starting point by xa in an x direction and by ya in a y direction toward the outside of the overlap region;
point B2: a point shifted from a point B1 as a starting point by xb in the x direction and by yb in the y direction toward the outside of the overlap region;
point C2: a point shifted from a point C1 as a starting point by xc in the x direction and by yc in the y direction toward the outside of the overlap region; and
point D2: a point shifted from a point D1 as a starting point by xd in the x direction and by yd in the y direction toward the outside of the overlap region;
the points A1, B1, C1, and D1 being defined as follows:
point A1: an intersection of an outer edge of an outermost electrode on one end side in the acoustic wave propagation direction and the first busbar;
point B1: an intersection of an extension line of an outer edge of an outermost electrode on another end side in the acoustic wave propagation direction and the first busbar;
point C1: an intersection of an extension line of the outer edge of the outermost electrode on the one end side in the acoustic wave propagation direction and the second busbar; and
point D1: an intersection of the outer edge of the outermost electrode on the other end side in the acoustic wave propagation direction and the second busbar.

2. The acoustic wave device according to claim 1, wherein a thickness of the piezoelectric film is in a range of about 500 nm±300 nm.

3. The acoustic wave device according to claim 1, wherein the acoustic wave device is configured to use a bulk wave in a thickness shear mode.

4. The acoustic wave device according to claim 1, wherein the piezoelectric film is made of one of lithium niobate or lithium tantalate, and d/p is about 0.5 or less, where d is a thickness of the piezoelectric film and p is a distance between centers of adjacent first and second electrode fingers.

5. The acoustic wave device according to claim 1, wherein
the functional electrode is an IDT electrode including the at least one first electrode finger and the at least one second electrode finger;
the at least one first electrode finger includes a plurality of first electrode fingers; and
the at least one second electrode finger includes a plurality of second electrode fingers.

6. The acoustic wave device according to claim 1, wherein
the functional electrode is an IDT electrode including the at least one first electrode finger and the at least one second electrode finger;
the at least one first electrode finger includes a plurality of first electrode fingers;
the at least one second electrode finger includes a plurality of second electrode fingers; and
the acoustic wave device further includes reflectors on both sides of the functional electrode in the acoustic wave propagation direction and is configured to use a plate wave.

7. The acoustic wave device according to claim 5, wherein
the IDT electrode includes a first surface on a piezoelectric film side, a second surface facing the first surface, and side surfaces connected to the first surface and the second surface;
the IDT electrode includes a side-surface-inclined electrode finger including portions in which the side surfaces are connected to the first surface and are inclined; and
when an angle between the side surfaces of the side-surface-inclined electrode finger and a principal surface of the piezoelectric film is α and when the angle α is α>about 90° in a case in which the side surfaces are inclined away from a center in a widthwise direction of the side-surface-inclined electrode finger as the side surfaces approach the second surface from the first surface, α>about 90° in the portions of the side surfaces of the side-surface-inclined electrode finger that are connected to the first surface.

8. The acoustic wave device according to claim 7, wherein
the side surfaces of the side-surface-inclined electrode finger include a first portion connected to the first surface and a second portion located closer to the second surface than is the first portion; and
the angle α in the first portion is different from the angle α in the second portion.

9. An acoustic wave device comprising:
a support substrate including a recess;
a piezoelectric film covering the recess of the support substrate and defining a cavity together with the recess; and
a functional electrode on the piezoelectric film; wherein
the functional electrode includes:
 first and second busbars;
 at least one first electrode finger including one end connected to the first busbar; and
 at least one second electrode finger including one end connected to the second busbar; and
when an overlap region is defined as a region in which the first and second electrode fingers overlap each other in an acoustic wave propagation direction, points A2, B2, C2, and D2 are all inside the cavity when, at the points A2, B2, C2, and D2,
xa<about 2 μm, ya<about 2 μm;
xb<about 2 μm, yb<about 2 μm;
xc<about 2 μm, yc<about 2 μm;
xd<about 2 μm, and yd<2 about μm;

the points A2, B2, C2, and D2 being defined as follows:
point A2: a point shifted from a point A1 as a starting point by xa in an x direction and by ya in a y direction toward the outside of the overlap region;
point B2: a point shifted from a point B1 as a starting point by xb in the x direction and by yb in the y direction toward the outside of the overlap region;
point C2: a point shifted from a point C1 as a starting point by xc in the x direction and by yc in the y direction toward the outside of the overlap region; and
point D2: a point shifted from a point D1 as a starting point by xd in the x direction and by yd in the y direction toward the outside of the overlap region; and
the points A1, B1, C1, and D1 being defined as follows:
point A1: an intersection of an outer edge of an outermost electrode on one end side in the acoustic wave propagation direction and the first busbar;
point B1: an intersection of an extension line of an outer edge of an outermost electrode on another end side in the acoustic wave propagation direction and the first busbar;
point C1: an intersection of an extension line of the outer edge of the outermost electrode on the one end side in the acoustic wave propagation direction and the second busbar; and
point D1: an intersection of the outer edge of the outermost electrode on the other end side in the acoustic wave propagation direction and the second busbar.

10. The acoustic wave device according to claim 9, wherein a thickness of the piezoelectric film is in a range of about 500 nm±300 nm.

11. The acoustic wave device according to claim 9, wherein the acoustic wave device is configured to use a bulk wave in a thickness shear mode.

12. The acoustic wave device according to claim 9, wherein the piezoelectric film is made of one of lithium niobate or lithium tantalate, and d/p is about 0.5 or less, where d is a thickness of the piezoelectric film and p is a distance between centers of adjacent first and second electrode fingers.

13. The acoustic wave device according to claim 9, wherein
the functional electrode is an IDT electrode including the at least one first electrode finger and the at least one second electrode finger;
the at least one first electrode finger includes a plurality of first electrode fingers; and
the at least one second electrode finger includes a plurality of second electrode fingers.

14. The acoustic wave device according to claim 9, wherein
the functional electrode is an IDT electrode including the at least one first electrode finger and the at least one second electrode finger;
the at least one first electrode finger includes a plurality of first electrode fingers;
the at least one second electrode finger includes a plurality of second electrode fingers; and
the acoustic wave device further includes reflectors on both sides of the functional electrode in the acoustic wave propagation direction and is configured to use a plate wave.

15. The acoustic wave device according to claim 13, wherein
the IDT electrode includes a first surface on a piezoelectric film side, a second surface facing the first surface, and side surfaces connected to the first surface and the second surface;
the IDT electrode includes a side-surface-inclined electrode finger including portions in which the side surfaces are connected to the first surface and are inclined; and
when an angle between the side surfaces of the side-surface-inclined electrode finger and a principal surface of the piezoelectric film is α and when the angle α is α>about 90° in a case in which the side surfaces are inclined away from a center in a widthwise direction of the side-surface-inclined electrode finger as the side surfaces approach the second surface from the first surface, α>about 90° in the portions of the side surfaces of the side-surface-inclined electrode finger that are connected to the first surface.

16. The acoustic wave device according to claim 15, wherein
the side surfaces of the side-surface-inclined electrode finger include a first portion connected to the first surface and a second portion located closer to the second surface than is the first portion; and
the angle α in the first portion is different from the angle α in the second portion.

17. The acoustic wave device according to claim 16, wherein α=about 90° in the second portions of the side surfaces of the side-surface-inclined electrode finger.

18. The acoustic wave device according to claim 15, wherein α>about 90° over an entirety of the side surfaces of the side-surface-inclined electrode finger.

19. The acoustic wave device according to claim 15, wherein a portion of the side-surface-inclined electrode finger, including the first surface, in which α>about 90° includes Ti, Al, or Mo, or a composite material including Ti, Al, or Mo with carbon.

20. An acoustic wave device comprising:
a support substrate including a cavity;
a piezoelectric film on the support substrate; and
a functional electrode on the piezoelectric film; wherein
the functional electrode includes:
first and second busbars;
at least one first electrode finger including one end connected to the first busbar; and
at least one second electrode finger including one end connected to the second busbar; and
when an overlap region is defined as a region in which the first and second electrode fingers overlap each other in an acoustic wave propagation direction, points A2, B2, C2, and D2 are all outside the cavity when, at the points A2, B2, C2, and D2,
xa>about 25 μm, ya>about 25 μm;
xb>about 25 μm, yb>about 25 μm;
xc>about 25 μm, yc>about 25 μm;
xd>about 25 μm, and yd>about 25 μm; and
the points A2, B2, C2, and D2 are all inside the cavity when, at the points A2, B2, C2, and D2,
xa<about 2 μm, ya<about 2 μm;
xb<about 2 μm, yb<about 2 μm;
xc<about 2 μm, yc<about 2 μm;
xd<about 2 μm, and yd<about 2 μjm;
the points A2, B2, C2, and D2 being defined as follows:
point A2: a point shifted from a point A1 as a starting point by xa in an x direction and by ya in a y direction toward the outside of the overlap region;

point B2: a point shifted from a point B1 as a starting point by xb in the x direction and by yb in the y direction toward the outside of the overlap region;

point C2: a point shifted from a point C1 as a starting point by xc in the x direction and by yc in the y direction toward the outside of the overlap region; and point D2: a point shifted from a point D1 as a starting point by xd in the x direction and by yd in the y direction toward the outside of the overlap region;

the points A1, B1, C1, and D1 being defined as follows:

point A1: an intersection of an outer edge of an outermost electrode on one end side in the acoustic wave propagation direction and the first busbar;

point B1: an intersection of an extension line of an outer edge of an outermost electrode on another end side in the acoustic wave propagation direction and the first busbar;

point C1: an intersection of an extension line of the outer edge of the outermost electrode on the one end side in the acoustic wave propagation direction and the second busbar; and point D1: an intersection of the outer edge of the outermost electrode on the other end side in the acoustic wave propagation direction and the second busbar.

* * * * *